(12) United States Patent
Sytař et al.

(10) Patent No.: US 9,490,100 B2
(45) Date of Patent: Nov. 8, 2016

(54) METHOD OF USING A COMPOUND PARTICLE-OPTICAL LENS

(71) Applicant: FEI Company, Hillsboro, OR (US)

(72) Inventors: Petr Sytař, Brno (CZ); Petr Hlavenka, Brno (CZ); Lubomír Tů ma, Brno (CZ)

(73) Assignee: FEI COMPANY, Hillsboro, OR (US)

( * ) Notice: Subject to any disclaimer, the term of this patent is extended or adjusted under 35 U.S.C. 154(b) by 351 days.

(21) Appl. No.: 14/021,480

(22) Filed: Sep. 9, 2013

(65) Prior Publication Data

US 2014/0070098 A1   Mar. 13, 2014

Related U.S. Application Data

(60) Provisional application No. 61/698,832, filed on Sep. 10, 2012.

(30) Foreign Application Priority Data

Sep. 10, 2012 (EP) ..................................... 12183662

(51) Int. Cl.
*H01J 37/14* (2006.01)
*H01J 37/145* (2006.01)
*H01J 37/28* (2006.01)

(52) U.S. Cl.
CPC .............. *H01J 37/14* (2013.01); *H01J 37/145* (2013.01); *H01J 37/28* (2013.01); *H01J 2237/1035* (2013.01); *H01J 2237/248* (2013.01);

(Continued)

(58) Field of Classification Search
CPC .................... H01J 37/145; H01J 2237/04926; H01J 2237/1035; H01J 2237/26; H01J 37/26; H01J 2237/248; H01J 37/14; H01J 37/1413; H01J 2237/24475; H01J 2237/2448

USPC ................................................. 250/307, 310
See application file for complete search history.

(56) References Cited

U.S. PATENT DOCUMENTS 4,897,545 A * 1/1990 Danilatos ...................... 250/310
5,866,905 A * 2/1999 Kakibayashi et al. ........ 250/311

(Continued)

FOREIGN PATENT DOCUMENTS

DE          19845329          9/1999
EP          2518756 A2        10/2012

*Primary Examiner* — Robert Kim
*Assistant Examiner* — Kevin Chung
(74) *Attorney, Agent, or Firm* — Scheinberg & Associates, P.C.; Michael O. Scheinberg

(57) ABSTRACT

The invention relates to a compound objective lens for a Scanning Electron Microscope having a conventional magnetic lens excited by a first lens coil, an immersion magnetic lens excited by a second lens coil, and an immersion electrostatic lens excited by the voltage difference between the sample and the electrostatic lens electrode. For a predetermined excitation of the lens, the electron beam can be focused on the sample using combinations of excitations of the two lens coils. More BSE information can be obtained when the detector distinguishes between BSE's (202) that strike the detector close to the axis and BSE's (204) that strike the detector further removed from the axis. By tuning the ratio of the excitation of the two lens coils, the distance from the axis that the BSE's impinge on the detector can be changed, and the compound lens can be used as an energy selective detector.

9 Claims, 3 Drawing Sheets

Figure 1:
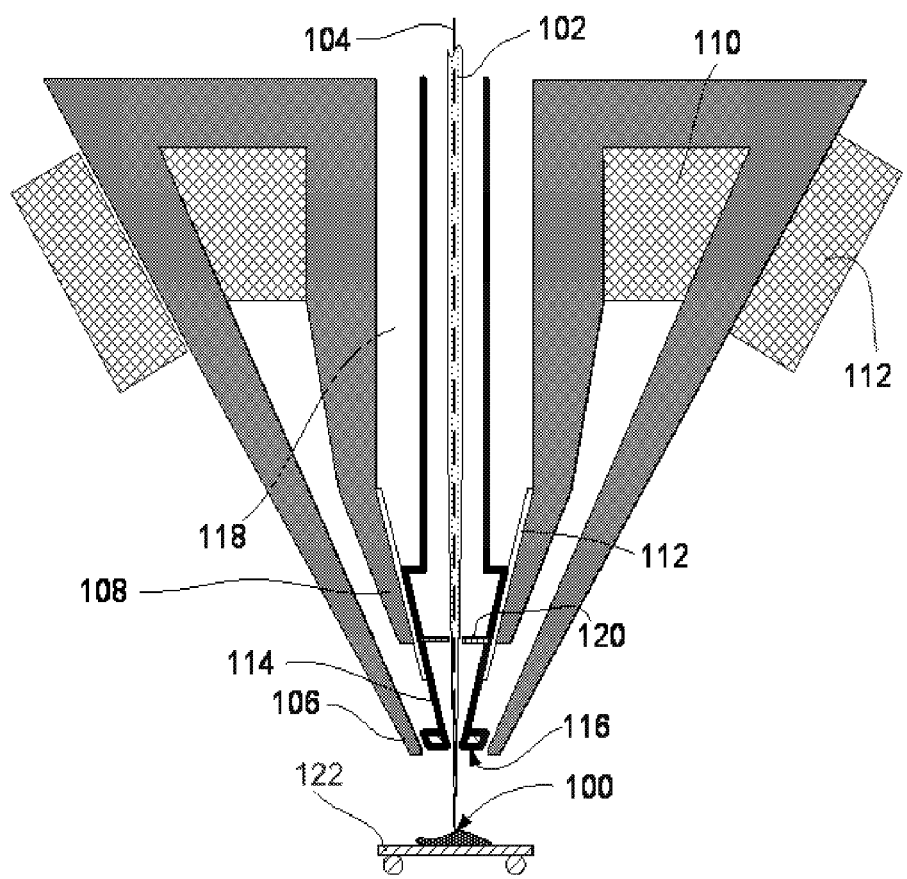

(52) U.S. Cl.
CPC ............. *H01J2237/24475* (2013.01); *H01J 2237/24485* (2013.01)

(56) References Cited

U.S. PATENT DOCUMENTS

| | | |
|---|---|---|
| 6,531,697 B1 | 3/2003 | Nakamura et al. |
| 6,590,210 B1 | 7/2003 | Essers |
| 6,646,261 B2 | 11/2003 | Krans |
| 6,822,233 B2 | 11/2004 | Nakamura et al. |
| 7,067,820 B2 | 6/2006 | Buijsse |
| 7,847,267 B2 | 12/2010 | Shemesh et al. |
| 2008/0011949 A1* | 1/2008 | Sannomiya ........... H01J 37/153 250/311 |
| 2009/0242792 A1* | 10/2009 | Hosoya et al. ............... 250/397 |

* cited by examiner

METHOD OF USING A COMPOUND PARTICLE-OPTICAL LENS

This Application claims priority from U.S. Provisional Application 61/698,832, filed Sep. 10, 2012, which is hereby incorporated by reference.

The invention relates to a method of forming an image of a sample at a sample position by scanning a finely focused beam of charged particles over the sample, as a result of which backscattered electrons emerge from the sample, the image formed by detecting backscattered electrons, the beam focused by a compound charged particle lens, the compound lens showing
- a symmetry axis;
- a first magnetic lens pole near the sample position and a second magnetic lens pole more removed from the sample position;
- a first coil for generating a focusing magnetic field between the first magnetic lens pole and the second magnetic lens pole
- a second lens coil for generating a focusing immersion magnetic field between the first magnetic lens pole and the sample position; and
- an electrode with a central hole, the central hole for passing the beam of charged particles through the lens to the sample, the electrode for generating a decelerating electric field between the lens and the sample by applying a voltage difference between the electrode and the sample;
- the compound lens thus having at least three parameters to determine the focal strength of the compound lens;
- the compound lens comprising an electron detector showing
  - a sensitive surface with a central hole, the sensitive surface coinciding with and electrically forming a part of the electrode; the method comprising
  - exciting the immersion coil, the lens coil and the decelerating electric field of the compound lens so that
    - the finely focused beam is focused at the sample; and
    - the voltage difference of the sample is a predetermined voltage difference; and
  - detecting backscattered electrons impacting on the detector, the backscattered electrons emerging from the sample with a selected angle α and a selected energy E, with α the angle with which the backscattered electrons leave the sample with respect to the symmetry axis of the compound lens, and E the energy with which the backscattered electrons leave the sample.

The invention also relates to a compound charged particle lens equipped to perform the method.

Such a method is inter alia known from European Patent Application EP12165423. Said patent application discloses a lens as set forth forming part of a Scanning Electron Microscope (SEM) column. A detector in the form of a scintillator mounted on a silicon photomultiplier (SiPMT) or another type of electron detector, including one or more photo-diodes, is mounted on the surface of the electrode and form part of the surface of the electrode.

A SEM column comprises an electron source for producing an electron beam with a selectable energy of, for example, between 200 eV and 30 keV, lenses to manipulate (focus, magnify, demagnify) the electron beam, deflectors for deflecting and centering the beam, and an objective lens to focus the beam on a sample. The objective lens may for example be a simple magnetic lens, an immersion lens in which the sample is immersed in a magnetic field, or a compound lens as described here. Advantages of such a compound lens, as known to the person skilled in the art, are for example improved resolution at low energies due to the decelerating electrostatic field, improved resolution due to the immersion magnetic field. However, not all samples can be viewed with all 'modes' of such a compound lens: for example a magnetisable sample, such as old fashioned audiotape or videotape, cannot be viewed in an immersion magnetic field without changing the magnetic properties of the sample.

As the compound lens has at least three degrees determining the focal length of the lens, several combinations of electrostatic field, magnetic immersion field (governed by the excitation of the first coil) and focusing magnetic field (governed by the excitation of the second coil) can be used to form a focus on the sample. In many cases the electrostatic field is used to determine the energy with which the electrons impact on the sample. Even then a range of combinations of excitation of the first and the second coil can be used to form the focus at the appropriate location.

When electrons impinge on a sample, secondary radiation is formed. Most importantly secondary electrons (SE's) are formed, exiting the sample with an energy of less than 50 eV, and backscattered electrons (BSE's) are formed, exiting the sample with an energy in excess of 50 eV.

Assuming the compound lens uses an electrostatic field that decelerates the impinging beam, the direction of the electrostatic field is defined: the SE's are accelerated to the lens and pass through the hole in the electrode. This is the normal mode in which the compound lens is used.

It is noted that the SE's can be detected by a detector between the electrode and the electron source.

BSE's leave the sample with an energy from e.g. 50 eV up to an energy equal to the energy with which the impinging electrons land on the sample, for example 10 keV or more. The BSE's emerge from the sample under an angle α relative to the normal to the sample's surface, and an energy E. As known to the person skilled in the art the statistical distribution of this angle and energy is a function of sample material and beam energy.

There is a demand for a configurable compound lens with electron detector that gives information for energy and/or angle distribution of BSE's.

To that end a method of using the compound lens with the electron detector is characterized in that
- the electron detector is equipped to distinguish backscattered electrons of a first group and a second group, the first group impacting on the detector closer to the symmetry axis than the second group, the backscattered electrons from the first group having different combinations of α and E than electrons of the second group; and
- the ratio of excitation of the first coil and the second coil is used to control the part of the backscattered electrons belonging to the first group and the part of the backscattered electrons belonging to the second group, while keeping the focus on the sample.

The invention is based on the insight that several ratios (or combinations) of excitation of the first and the second coil, each ratio resulting in a beam focused on the sample. However, different ratios result in a different radial distribution of BSE's over the detector. By now forming the detector such that the detector can give information of the distance from the axis that the detected electrons impact the detector, additional information about the BSE's is gathered.

Preferably this is done by equipping the detector with two or more annular detector areas (sensitive areas).

However, also a pixilated detector, such as a CMOS chip, can be used as the data from such a detector can be processed to resemble the data of two or more annular areas.

It is noted that some BSE's will pass through the hole of the detector/electrode surface. Such electrons can be detected by a detector between the electron source and the detector/electrode. Such detectors are known, e.g. the detector from U.S. Pat. No. 6,646,261.

It is mentioned that the detector can be a semiconductor detector, but also a scintillator based detector, using for example a SiPMT, or a conventional PMT, with or without light guides.

It is noted that German Patent Application Publication No. DE198 45 329 A1 to Essers describes a compound lens with a through-the-lens detector. This patent application differs from the invention in that it does not describe how to distinguish between two groups of electrons impinging on the different parts of the detector. Even when the teaching of this patent application would be combined with the teaching of a segmented detector as described in US patent application publication No. US2006/054814 A1 to Shemesh, Essers still does not describe that the excitation of the coils used for generating the immersion field and the non-immersion magnet field can be used for controlling the ratio of the two groups of electrons.

It is further noted that US patent application publication No. US2003/0127595 A1 to Nakamura describes a transmission electron microscope where a sample is immersed in the magnetic field of an objective lens. Detectors are placed at a position such that the objective lens is placed between the sample and the detectors. One detector is used for backscattered electrons, the other one for secondary electrons. As known to the skilled person secondary electrons are normally defined as electrons with an energy below 50 eV and backscattered electrons with an energy above 50 eV. Nakamura does not describe ways to change the ratio of electrons detected by the two detectors. Nakamura does not teach the use of an electrostatic focusing field either. Therefore Nakamura does not teach a compound lens, nor a way to change the ratio of electrons detected by the two detectors.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the invention as set forth in the appended claims.

For a more thorough understanding of the present invention, and advantages thereof, the invention is explained using figures, in which identical reference numerals indicate corresponding features.

Figure 2:
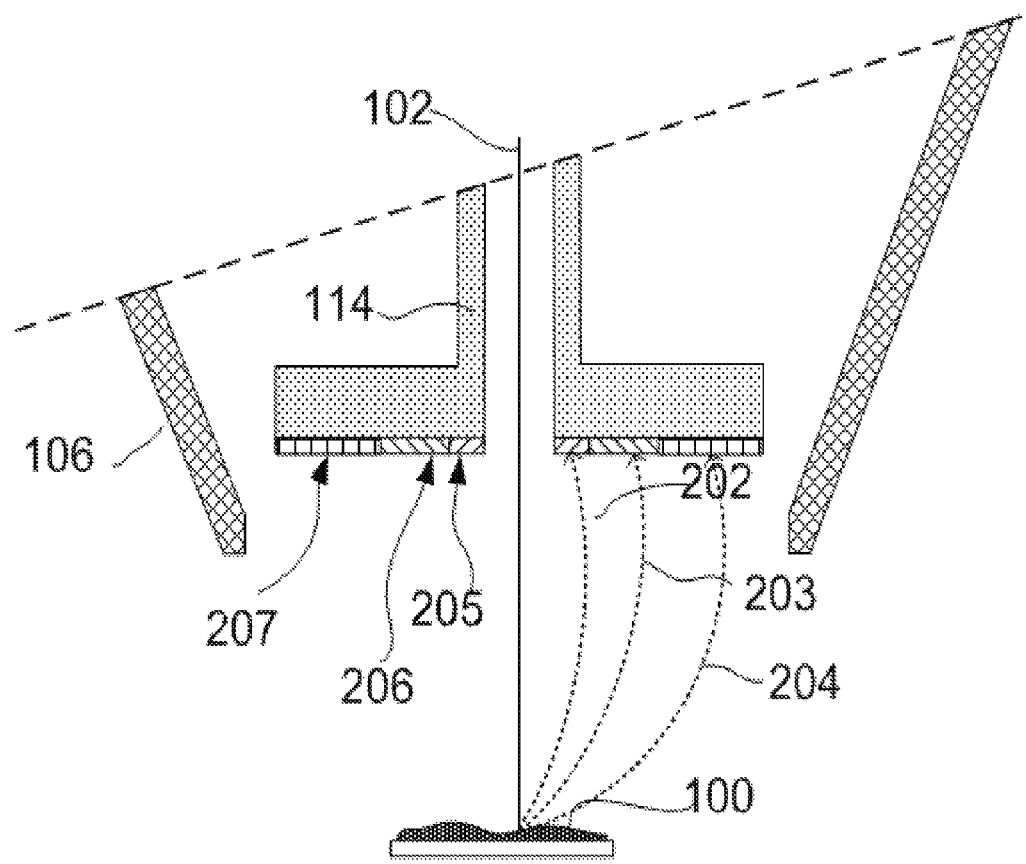
Figure 3:
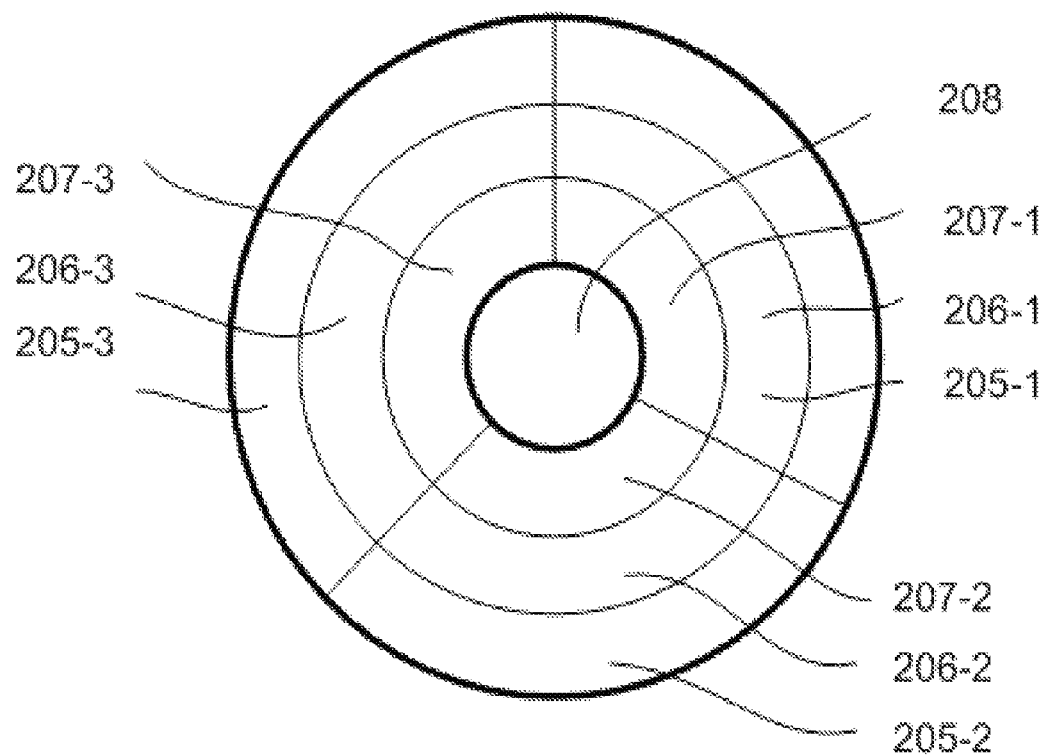

To that end:

FIG. 1 schematically shows a prior art compound lens;

FIG. 2 schematically shows a detail of a compound lens according to the invention; and FIG. 3 schematically shows a detector for use in the compound lens according to the invention.

FIG. 1 schematically shows a prior art compound lens.

FIG. 1 schematically shows a beam of charged particles 102 travelling around particle-optical axis 104 and impinging on a sample 100. The sample is mounted on a sample carrier 122 that is movable with respect to the beam. The objective lens comprises a magnetic yoke with two pole pieces 106 and 108 guiding the magnetic field generated with coil 110 to an area near the beam. The yoke is electrically connected to ground. The outer pole piece 106 also guides the magnetic field generated by coil 112 to the sample, thus generating an immersion field. Electrode 114 is formed as a tube surrounding the beam, ending with a face 116 facing the sample. Insulator 112 centers the tube within the magnetic yoke and electrically insulates the two.

It is noted that the tube and the face need not be one piece, or even one material. Important for its functioning as one electrode is that the parts are sufficiently electrically conductive and electrically connected to each other to form one electric surface.

On the face 116 a sensitive surface, such as a YAP:Ce or a YAG:Ce crystal is mounted. The photons generated by the scintillator are detected with a photon detector. As is clear from the figure, the scintillator should be formed as a disk with a central hole in it.

It is noted that the scintillator disk is preferably coated with a thin (10-100 nm) layer of aluminum, the coating forming a conductive layer and the coating reflecting photons that otherwise would emerge from the scintillator in the direction of the sample.

A second charged particle detector 120 is located in an electrically field free region within the second electrode. This second detector may, for example, be a solid state electron detector, or a detector comprising a scintillator and photon detector.

It is noted that magnetic deflectors can be placed in, for example, area 118 between the inner yoke and the second electrode.

It is noted that the sensitive surface may, instead of being a scintillator based detector as described above, also be a semiconductor based detector, e.g. a pixilated CMOS detector or a segmented photodetector.

It is also noted that it is known to further decelerate the beam between the first electrode 106 and the sample position by biasing the sample to a positive energy.

The primary electrons, when impinging on the sample, cause the emission of secondary radiation, including backscattered electrons (BSEs) and secondary electrons (SEs). From a detection point of view the difference between these two is that an SE is often defined as an electron emerging from the sample with an energy of less than 50 eV, many of those with an energy of less than 5 eV, while a BSE emerges from the sample with an energy above 50 eV (up to the energy of the primary beam). The electric field between the sample and the second electrode directs both these electrons towards the direction of face 116, and the electrons enter the magnetic immersion field breaking out of the lens. The low energy electrons (all SEs and a small part of the BSEs) are kept so close to the axis that they travel through the hole in face 116 and enter the field free region within the second electrode. Many of these electrons are then detected by detector 120.

The back-scattered electrons with a large energy, for example an energy in excess of 80% of the energy of the primary electrons, are less confined by the combined effect of the electrostatic and magnetic field and hit the face 116, and thus the scintillator, thereby generating photons to be detected by a photon detector.

Due to the potential difference between the sample and the electrode, the BSEs impinge on the scintillator with an energy of several keV. Using the lens shown in FIG. 1, a grounded sample and first electrode (and yoke) and a potential of approximately +8 kV on the electrode, a detection efficiency for BSEs of 85% is obtained, depending on working distance (distance between sample and first pole piece), landing energy and BSE energy (influenced by for example a bias voltage between sample and first pole piece).

FIG. 2 schematically shows a detail of a compound lens according to the invention.

FIG. 2 schematically shows the sample 100, the tip of lens pole 106, the extremity of the electrode 114, with the detector and beam 102. The detector is now split in three annular rings 205, 206 and 207. Alternatively, the detector could be a pixilated detector, with one ring, e.g., 207 comprising a first group of pixels, the signals from the pixels in the first groups being combined to give a first signal and the signals of a second group of pixels, e.g., 205 or 206, being combined to give a second signal, the first signal proportional to the amount of impinging electrons of the first group and the second signal proportional to the amount of impinging electrons of the second group. A first group of BSE's, comprising BSE 202, impinge on ring 205, a second group of BSE's, including BSE 203, impinge on ring 206 and a third group of BSE's, including BSE 204 impinge on ring 207. Hereby the, in this case three, groups of BSE's can be measured separately from each other. The three groups have different combinations of α (the angle relative to the perpendicular to the surface of the sample with which the BSE emerges from the sample) and E (the energy with which the BSE emerges from the sample). Using this detector information, such as material contrast, can be obtained.

FIG. 3 schematically shows a detector for use in the compound lens according to the invention.

FIG. 3 not only shows a detector in which the sensitive parts are arranged as annular segments. Around central hole 208 three annular segments, three segments 205-1 . . . 205-3 are arranged, surrounded by a second group of segments 206-1 . . . 206-3 and a third group of segments 207-1 . . . 207-3, each group of segments forming an annulus.

This detector not only enables, for example, material contrast, but, as clear to the skilled artisan, topological contrast resulting in non-circle symmetric distribution of the BSE's over the detector annuli.

So, in conclusion: a compound objective lens for a Scanning Electron Microscope, the lens comprising a conventional magnetic lens excited by lens coil 110, an immersion magnetic lens excited by lens coil 112, and an immersion electrostatic lens excited by the voltage difference between the sample 100 and electrode 114. For a predetermined excitation of the electrostatic immersion lens the electron beam 102 can be focused on the sample using several combinations of excitations of coils 110 and 112.

An electron detector (116) is positioned close to the sample (100) to detect backscattered electrons (BSE's). Inventors found that more information of the BSE's could be obtained when the detector can distinguish between BSE's that strike the detector close to the axis and BSE's that strike the detector further removed from the axis.

Inventors found that, by tuning the ratio of the excitation of the coils 110 and 112, the distance from the axis that the BSE's impinge on the detector can be changed, and thus the compound lens can be made to function as an energy selective detector.

The invention claimed is:

1. A method of forming an image of a sample at a sample position by scanning a finely focused beam of charged particles over the sample, as a result of which backscattered electrons emerge from the sample, the image formed by detecting backscattered electrons, the beam focused by a compound charged particle lens, the compound lens having:
a symmetry axis;
a first magnetic lens pole near the sample position and a second magnetic lens pole more removed from the sample position;
a first coil for generating a focusing magnetic field between the first magnetic lens pole and the second magnetic lens pole;
a second lens coil for generating a focusing immersion magnetic field between the first magnetic lens pole and the sample position; and
an electrode with a central hole, the central hole for passing the beam of charged particles through the lens to the sample, the electrode for generating a decelerating electric field between the lens and the sample by applying a voltage difference between the electrode and the sample;
the compound lens having at least three parameters to determine the focal strength of the compound lens; and
the compound lens comprising an electron detector showing a sensitive surface with a central hole, the sensitive surface coinciding with and electrically forming a part of the electrode;
the method comprising:
exciting the immersion coil, the lens coil and the decelerating electric field of the compound lens so that:
the finely focused beam is focused at the sample; and
the voltage difference of the sample is a predetermined voltage difference; and
detecting backscattered electrons impacting on the detector, the backscattered electrons emerging from the sample with a selected angle α and a selected energy E, with α the angle with which the backscattered electrons leave the sample with respect to the symmetry axis of the compound lens, and E the energy with which the backscattered electrons leave the sample;
wherein:
the electron detector distinguishes backscattered electrons of a first group and a second group, the first group impacting on the detector closer to the symmetry axis than the second group, the backscattered electrons from the first group having different combinations of α and E than electrons of the second group; and
the ratio of exciting the first coil and the second coil is used to control the part of the backscattered electrons belonging to the first group and the part of the backscattered electrons belonging to the second group, while keeping the beam focused on the sample.

2. The method of claim 1 in which the detector is a detector with two or more annular detection areas, one of the annular detection areas for detecting electrons from the first group and the other annular detection area for detecting electrons from the second group.

3. The method of claim 1 in which the detector is a pixilated detector, and the signal of a first group of pixels is combined to give a first signal and the signal of a second group of pixels is combined to give a second signal, the first signal proportional to the amount of impinging electrons of the first group and the second signal proportional to the amount of impinging electrons of the second group.

4. The method of claim 1 in which a second detector is positioned further removed from the sample position than the detector coinciding with the electrode, the second detector giving a signal proportional to a third group of backscattered electrons, the third group of backscattered electrons passing through the central hole.

5. A compound charged particle lens, the compound lens having:
a symmetry axis;
a first magnetic lens pole near the sample position and a second magnetic lens pole more removed from the sample position;
an immersion coil for generating a focused magnetic field between the first magnetic lens pole and the sample position;
a lens coil for generating a focusing magnetic field between the first magnetic lens pole and the second magnetic lens pole;
an electrode with a central hole, the central hole for passing the beam of charged particles through the lens to the sample, the electrode for generating a decelerating electric field between the lens and the sample by applying a voltage difference between the electrode and the sample;
the compound lens having at least three parameters to determine the focal strength of the compound lens;
the compound lens comprising an electron detector having a sensitive surface with a central hole, the sensitive surface coinciding with the electrode;
wherein:
the detector distinguishes between impinging backscattered electrons from a first group and a second group, the first group impinging closer to the axis than the second group; and
in a method of forming an image, the ratio of exciting the first coil and the second coil is used to control the part of the backscattered electrons belonging to the first group and the part of the backscattered electrons belonging to the second group, while keeping the beam focused on the sample.

6. The compound charged particle lens of claim 5 in which the detector is a detector with two or more annular detection areas, one of the annular detection areas for detecting electrons from the first group and the other annular detection area for detecting electrons from the second group.

7. The compound charged particle lens of claim 5 in which the detector is a pixilated detector, and the signal of a first group of pixels is combined to give a first signal and the signal of a second group of pixels is combined to give a second signal, the first signal proportional to the amount of impinging electrons of the first group and the second signal proportional to the amount of impinging electrons of the second group.

8. The compound charged particle lens of claim 5 in which a second detector is positioned further removed from the sample position than the detector coinciding with the electrode, the second detector giving a signal proportional to a third group of backscattered electrons, the third group of backscattered electrons passing through the central hole.

9. The compound charged particle lens of claim 5 in which the detector is a semiconductor detector or a scintillator detector.

* * * * *